United States Patent [19]

Yokoyama

[11] 4,339,730
[45] Jul. 13, 1982

[54] AMPLIFIER WITH POWER SUPPLY SWITCHING

[75] Inventor: Kenji Yokoyama, Hamamatsu, Japan

[73] Assignee: Nippon Gakki Seizo Kabushiki Kaisha, Hamamatsu, Japan

[21] Appl. No.: 133,308

[22] Filed: Mar. 24, 1980

[30] Foreign Application Priority Data

Jul. 27, 1979 [JP] Japan .................................. 54-95831
Jul. 27, 1979 [JP] Japan .................................. 54-95832

[51] Int. Cl.³ .............................................. H03F 3/04
[52] U.S. Cl. ...................... 330/297; 330/262
[58] Field of Search ...................... 330/262, 263, 297

[56] References Cited

U.S. PATENT DOCUMENTS 4,087,759 5/1978 Iwamatsu ........................... 330/297

Primary Examiner—Michael J. Tokar
Attorney, Agent, or Firm—Cushman, Darby & Cushman

[57] ABSTRACT

A power amplifier is provided with a peak-holding means for holding, for a given period of time, a peak value of an input signal or an output signal of a power amplifying element there of and is provided also with a switching means for switching, to a selected value in accordance with an output from the peak-holding means, a dc power supply voltage which is supplied to said power amplifying elements. Such amplifier is able to enhance the power efficiency of the power amplifier as well as to reduce switching noises and to reduce the development of distortions.

26 Claims, 18 Drawing Figures

AMPLIFIER WITH POWER SUPPLY SWITCHING

BACKGROUND OF THE INVENTION (a) Field of the Invention

The present invention relates to an amplifier with power supply switching, more particularly to an audio power amplifier which is capable of effecting a signal amplifying operation with high power efficiency and with reduced switching noises and reduced distortions of signals.

(b) Description of the Prior Art

As a power amplifier for use in audio devices, there has been proposed and placed on the market an arrangement that a power supply voltage supplied from a power supply to the output stage of the power amplifier is varied in accordance with the level of either an input audio signal to be amplified, or of an amplified output audio signal, to thereby enhance the power efficiency of said output stage of the power amplifier.

For example, FIG. 1 illustrates a known such power amplifier, and shows a circuit diagram of the so-called E-class power amplifier. More particularly, the power amplifier shown in FIG. 1 is arranged so that a supply voltage $V_c$ powering an amplifying transistor 2 is varied in accordance with an audio signal level which is applied to an input terminal 1 of the power amplifier. Still more specifically, this known power amplifier is arranged so that, in case the input signal has a low signal level, the transistor 2 is operated by a voltage supplied from a power supply 3 via a diode 4, whereas in case the input audio signal has a high signal level, another transistor 6 which has been given base-biasing through a biasing source 5 is turned "on", so that the transistor 2 is operated by the sum voltage supplied from said power supply 3 and a power supply 7, to drive a load 8 by an operating current delivered by this transistor 2. According to this known power amplifier, it is possible to vary, as shown in FIG. 2, the supply voltage $V_c$ in accordance with the input audio signal level or with the output audio signal level $V_o$. Thus, it is possible to reduce the collector loss of the transistor 2, to thereby enhance the power efficiency of the amplifier per se. Such known power amplifier has been disclosed in, for example, U.S. Pat. Nos. 4,115,742, 3,622,899 and Japanese Laying-open Patent Application No. 50-45549.

However, such known power amplifier as briefed above has the disadvantage that the transistor 2 becomes saturated at the moment at which the input signal level exceeds the voltage level of the power supply 3, and that, owing to the resistance of the saturated transistor 2, the amplifying degree $G_m$ of this transistor 2 drops, causing distortions to develop.

FIG. 3 illustrates another example of such known power amplifier as discussed above. The power amplifier shown in FIG. 3 is of the arrangement that an input signal applied to an input terminal 9 is voltage-amplified by a driver amplifying circuit 10, and is subjected to power-amplification by transistors 11 and 12 connected in complementary SEPP fashion, and features the provision of Schmitt trigger circuits 14 and 15 which operate so that one 14 of them detects the point of time at which the level of the output voltage supplied to a load 13 exceeds, with respect to the positive region of the voltage, a certain positive value, whereas the other Schmitt circuit 15 detects the point of time at which the output voltage level for the load 13 exceeds, with respect to the negative region of this voltage, a certain negative value, so that the resulting outputs of these Schmitt trigger circuits cause switching circuits 16 and 17 to perform on-off actions. Whereby, the power supply voltage applied to the transistor 11 is switched to a high level positive voltage $+V_H$ when the aforesaid output voltage in the positive region is above a certain value, and to a low level positive voltage $+V_L$ when said output voltage in the positive region is lower than the certain value. Likewise, the aforesaid voltage of the power supply is switched to a high level negative voltage $-V_H$ when the output voltage in the negative region is above a certain value, and to a low level negative voltage $-V_L$ when this output voltage in the negative region is lower than the certain value. Reference numerals 18 and 19 represent diodes for inhibiting reverse current flow. This known power amplifier is able to vary, as shown in the voltage waveshape diagram in FIG. 4, the level of the power supply voltage in accordance with the level of the output voltage, thereby enhancing the power efficiency of the power amplifier in much the same way as is done by the known power amplifier shown in FIG. 1. Such known power amplifier as shown in FIG. 3 has been disclosed in Japanese Laying-open Utility Model Application No. 49-59451 and U.S. Pat. No. 3,319,175.

It should be noted here, however, that the known power amplifier shown in FIG. 3 has the arrangement that the switching-over of the power supply voltage to different values can be performed for each one cycle of the output signal $V_o$. Therefore, this power amplifier has the disadvantage that, in case the output signal level as well as its frequency are both high, the number of switching actions of the switching circuits 16 and 17 becomes great, so that the switching circuits 16 and 17 require switching elements capable of making high-speed switching actions, and that switching noises in the output signal become prominent accordingly.

As discussed above, those prior art power amplifiers shown in FIGS. 1 and 3 invariably provide a high power efficiency, but they have the operational disadvantages as stated above. From the nature of these disadvantages, however, such disadvantages cause a significant problem when used as a power amplifier for audio devices.

SUMMARY OF THE INVENTION

It is, therefore, a primary object of the present invention to provide a power amplifier which develops little distortions and has good power efficiency, by improving the switching arrangement of a power supply voltage for the power amplifier.

Another object of the present invention is to provide a power amplifier of the type described above, in which the power supply voltage is switched in magnitude only for the length of time in which the peak of the input signal level is held, thereby reducing the number of switching actions, and thus reducing the development of switching noises.

DETAILED DESCRIPTION OF THE PREFERRED EMBODIMENTS

Figure 5:
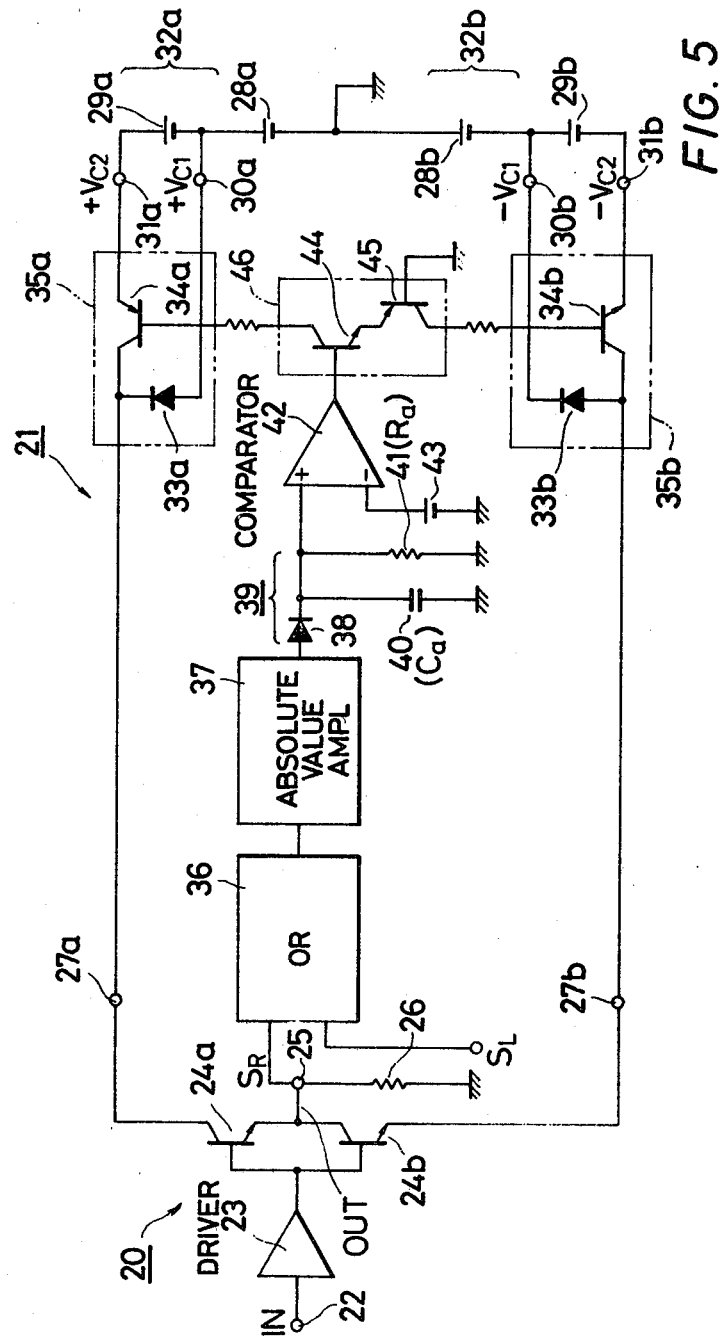
FIG. 5 is a circuit diagram of an embodiment of the power amplifier according to the present invention.

Description will hereunder be made of some preferred embodiments of the power amplifier according to the present invention by referring to FIG. 5 and subsequent drawings.

FIG. 5 is a circuit diagram showing an embodiment of the power amplifier for audio devices according to the present invention.

Figure 1:
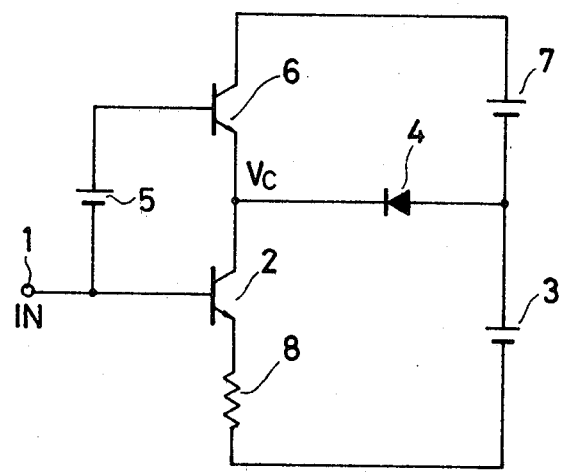
FIG. 1 is a circuit diagram of a known power amplifier.
Figure 2:
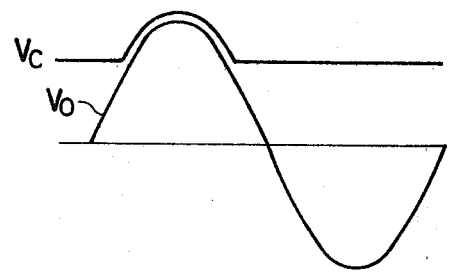
FIG. 2 is a diagram showing the relationship between the output signal $V_o$ and the power supply voltage $V_c$ of the power amplifier shown in FIG. 1.
Figure 3:
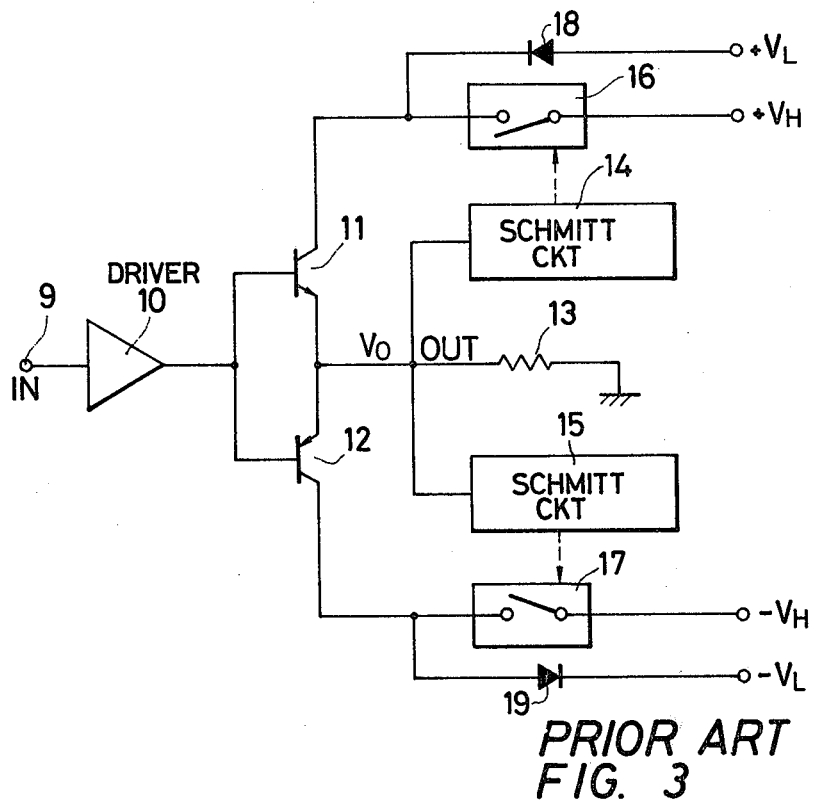
FIG. 3 is a circuit diagram of another known power amplifier.
Figure 4:
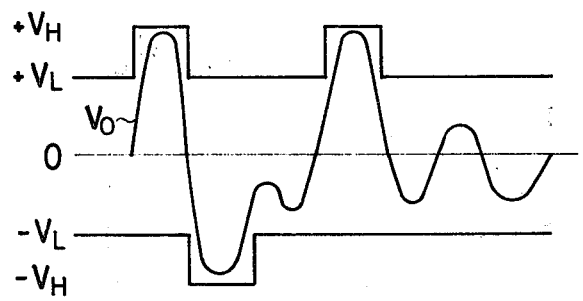
FIG. 4 is a diagram showing the relationship between the output signal $V_o$ of the power amplifier shown in FIG. 3 and the power supply voltages $V_H$ and $V_L$.

In FIG. 5, reference numeral 20 represents a power amplifier circuit, and numeral 21 represents a power supply circuit. This power amplifier circuit 20 is a known circuit similar to that shown in FIG. 3. This power amplifier circuit is of the arrangement that an input signal which is applied to an input terminal 22 is voltage-amplified by a driver amplifying circuit 23, and thereafter the resulting signal is subjected to power amplification by transistors 24a and 24b which are of a complementary SEPP connection, so that a load 26 is driven by an output signal derived at a common output terminal 25 of these transistors. In this circuit, the transistors 24a and 24b are arranged so that the collector of the transistor 24a is connected to a positive power supply terminal 27a of the power supply circuit 21 and the emitter of the transistor 24b is connected to a negative power supply terminal 27b of the power supply circuit 21, so that these transistors are supplied with power from said power supply circuit 21. In this embodiment, it is assumed that the signal source for the power amplifier is a stereo signal source, and also that the power amplifier circuit 20 illustrated is assigned to amplify a right channel signal, and further that another power amplifier circuit not shown having a circuit arrangement similar to that of this circuit 20 is assigned to amplify a left channel signal.

The power supply circuit 21 is arranged so that it supplies a positive and a negative voltage to the transistors 24a and 24b, respectively, and also that these positive and negative power supply voltages are varied in accordance with the output signals of the transistors 24a and 24b, respectively. This arrangement of the power supply circuit 21 will be described hereunder in further detail. The power supply circuit 21 has a positive power supply which is comprised of power supplies 28a and 29a, and a negative power supply which is comprised of power supplies 28b and 29b. Among the respective power supplies 28a, 29a and 28b, 29b, those power supplies 28a and 28b constitute a first power supply for outputting low level voltages $+V_{c1}$ and $-V_{c2}$ at terminals 30a and 30b, respectively. Also, the respective pairs of power supplies 28a, 29a and 28b, 29b constitute a second power supplies 32a and 32b for outputting high level voltages $+V_{c2}$ and $-V_{c2}$ at terminals 31a and 31b. The terminal 30a is connected, via a diode 33a, to the positive power supply terminal 27a. The terminal 31a, on the other hand, is connected to the emitter of the transistor 34a. Also, the collector of the transistor 34a is connected to the positive power supply terminal 27a. The diode 33a and the transistor 34a constitute a switching circuit 35a for selectively supplying a voltage derived across the terminals 30a and 31a to the positive power supply terminal 27a. Also, between the terminals 30b, 31b and the nagative power supply terminal 27b is provided another switching circuit 35b for selectively supplying a voltage derived across the terminals 30b and 31b to the negative power supply terminal 27b. In this arrangement, the switching circuit 35b is comprised of a diode 33b and a transistor 34b in much the same way as in the switching circuit 35a. The output voltages which are derived at the positive and negative power supply terminals 27a and 27b are adapted to be supplied also to power amplifying transistors in the power amplifying circuit assigned to amplify a left channel signal.

The aforesaid power supply circuit 21 is provided with an OR circuit 36 which uses, as its input signals, a right channel signal $S_R$ derived at the output terminal 25 of the power supply circuit 20 and also a left channel signal $S_L$ which is derived at an output terminal of another power amplifier circuit not shown. This OR circuit operates so that it takes logical OR of the signals $S_R$ and $S_L$ to supply its output to an absolute-value amplifying circuit 37. This absolute-value amplifying circuit 37 performs absolute-value amplification so that the signal which is supplied from the OR circuit 36 is derived in such manner that its positive and negative region components are taken out as a voltage in the same direction, and then it delivers its output signal to a peak-holding circuit 39. This peak-holding circuit 39 comprises a diode 38, a capacitor 40 having a value $C_a$, and a resistor 41 having a value $R_a$. This peak-holding circuit 39 operates so that is performs peak-holding of the absolute value of either the signal $S_R$ or $S_L$ supplied from the absolute-value amplifying circuit 37, for such period of time T as is determined by the time constant $C_a \cdot R_a$ and a threshold level at a comparator 42 described later. In this instance, the period of time T which is determined by the time constant $C_a \cdot R_a$ is set to be a time length corresponding to the lowest frequency of an audio signal, $S_R$ and $S_L$. The voltage which is peak-held by said peak-holding circuit 39 is supplied to a comparator 42. This comparator 42 compares this peak-held voltage with a reference voltage $V_T$ which is delivered from a reference voltage supply 43, and its comparison output is supplied to a switching-control circuit 46 which is composed by transistors 44 and 45. This switching-control circuit 46 operates so that it causes the transistors 44 and 45 to make on-off actions based on the aforesaid comparison output, and to thereby make a control of the switching actions between on and off of the transistors 34a and 34b of the switching circuits 35a and 35b.

Description will hereunder be made of the operation of the power amplifier circuit having the aforesaid arrangement.

Firstly, an output signal $S_R$ of the illustrated power amplifier circuit 20 and an output signal $S_L$ of another power amplifier circuit not shown are either or both passed to the OR circuit 36, and therefrom to the absolute-value amplifying circuit 37 for being subjected to absolute-value amplification therein, and thereafter the signal of signals are peak-held one after another of their momentary values by the peak-holding circuit 39. In such instance, the value of this peak-holding is compared with the reference voltage by the comparator 42.

Let us now assume that the absolute value of either the output signal $S_R$ or $S_L$ is lower than a threshold value $V_{th}$ which is set at a level slightly lower than the low level voltage $V_{c1}$. Whereupon, the comparator 43 will produce a low level output, thus rendering the transistors 44 and 45 to their "off" state to thereby render the transistors 34a and 34b to their "off" state. Whereby, the power supply circuit 21 will output, at their positive and negative power supply terminals 27a and 27b, a voltage $+V_{c1}$ and a voltage $-V_{c1}$ which are supplied thereto through the diodes 33a and 33b from the terminals 30a and 30b, respectively. Accordingly, in this embodiment, the transistors 24a and 24b of the illustrated power amplifier circuit 20 and the power amplifying transistors for the left channel power amplifier circuit not shown are supplied with the aforesaid voltages $+V_{c1}$ and $-V_{c1}$, respectively.

Also, in case the absolute-value of either the output signal $S_R$ or $S_L$ exceeds the aforesaid threshold value $V_{th}$, the comparator 42 delivers a high-level output to thereby turn the transistors 44 and 45 "on", causing the transistors 34a and 34b to be turned "on". As a result, the power supply circuit 21 will output, at their positive and negative power supply terminals 27a and 27b, a voltage $+V_{C2}$ and a voltage $-V_{c2}$ which are supplied thereto through its transistors 34a and 34b from the terminals 31a and 31b, respectively. In such part of operation, the diodes 33a and 33b serve to prevent the occurrence of interference between the voltages $+V_{c2}$, $-V_{c2}$ which are derived at the positive and negative power supply terminals 27a and 27b and the voltages $+V_{c1}$, $-V_{c1}$ which are derived at the terminals 30a and 30b, respectively. Accordingly, in this embodiment, the power amplifying transistors in the respective power amplifier circuits, one of which is not shown, are supplied with the aforesaid voltages $+V_{c2}$ and $-V_{c2}$, respectively. In this way, the respective power amplifier circuits are switched of their power supply voltages in accordance with the level of either the output signal $S_R$ or $S_L$ which is naturally proportional to the input signal, and thus these power amplifier circuits are both operated with good power efficiency without the development of saturation of the respective power amplifying transistors.

In the above-stated operation, the timing at which the voltages at the positive and negative power supply terminals 27a and 27b are switched from $+V_{c1}$, $-V_{c1}$ to $+V_{c2}$, $-V_{c2}$, i.e. the timing at which the transistors 34a and 34b are switched from their "off" state to their "on" state, is indeed the timing at which the value of either the output signal $S_R$ or $S_L$ has exceeded, either in its positive or negative region, the threshold value $V_{th}$. Also, the timing at which the voltages at the terminals 27a and 27b are switched from $+V_{c2}$, $-V_{c2}$ to $+V_{c1}$, $-V_{c1}$, i.e. the timing at which the transistors 34a and 34b are switched from their "on" state to their "off" state, is indeed the timing at which substantially the period of time T has lapsed from the time at which the absolute-value of the voltage of either the output signal $S_R$ or $S_L$ reaches a peak which exceeds the threshold value $V_{th}$. More particularly, the peak-holding circuit 39 operates in such way that, even when the absolute-value of the voltage of either the output signal $S_R$ or $S_L$ has dropped below the threshold value $V_{th}$, it holds the voltage immediately before dropping below the threshold value $V_{th}$, i.e. it holds the final peak value of voltage with which the transistors 34a and 34b are kept in their "on" state, only for the period of time T which is determined by the time constant $C_a \cdot R_a$ to thereby cause a delay in the timing at which the voltages at the positive and negative power supply terminals 27a and 27b are switched to the voltages $+V_{c1}$ and $-V_{c1}$, respectively. The peak-holding time T is set to correspond to the lowest frequency of the audio signal $S_R$, $S_L$. Therefore, the number of switching actions for switching the power supply voltages becomes quite small, and accordingly the development of switching noises can be minimized.

Figure 6:
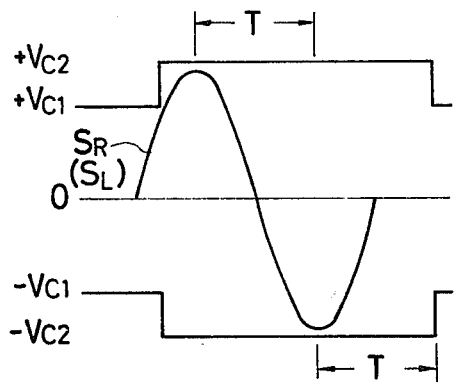
FIG. 6 is a diagram showing the relationship between the output signals $S_R$ and $S_L$ and the power supply voltages $V_{c1}$ and $V_{c2}$ in case the output signals of the power amplifier shown in FIG. 5 have a low frequency and a high level.
Figure 7:
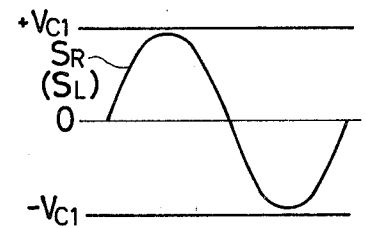
FIG. 7 is a diagram showing a similar relationship with a power supply voltage $V_{c1}$ in case the output signals $S_R$ and $S_L$ have a low frequency and a low level.
Figure 8:
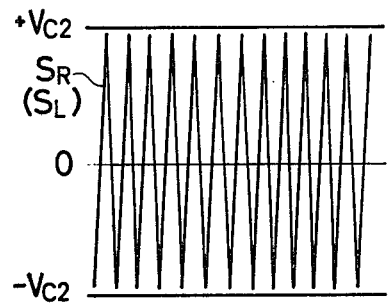
FIG. 8 is a diagram showing a similar relationship with a power supply voltage $V_{c2}$ in case the output signals $S_R$ and $S_L$ have a high frequency and a high level.
Figure 9:
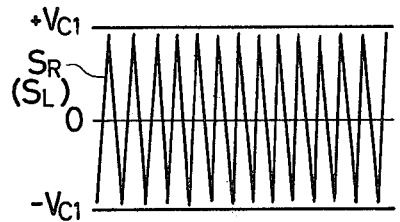
FIG. 9 is a diagram showing a similar relationship with a power supply voltage $V_{c1}$ in case the output signals $S_R$ and $S_L$ have a high frequency and a low level.

FIGS. 6 to 9 are diagrams showing the manner in which the voltages are outputted at the positive and negative power supply terminals 27a and 27b for a signal level and a frequency of either the output signal $S_R$ or $S_L$. FIG. 6 is a diagram showing the instance wherein the output signal $S_R$ or $S_L$ has a high signal level and a low frequency. FIG. 7 represents an instance wherein said output signal has a low signal level and a low frequency. FIG. 8 is a diagram showing the instance wherein the output signal has a high signal level and a high frequency. FIG. 9 is a diagram showing the instance wherein the output signal has a low signal level and a high frequency.

Figure 10:
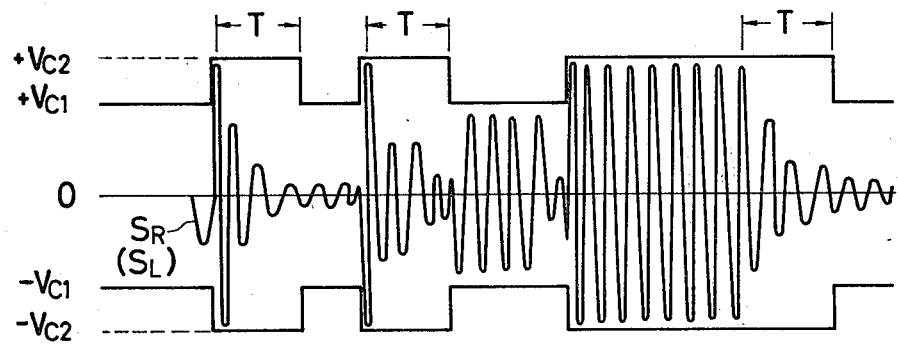
FIG. 10 is a diagram showing the relationship between the output signals $S_R$ and $S_L$ and the power supply voltages $V_{c1}$ and $V_{c2}$ in case the output signals represent an actual audio signal.

Also, FIG. 10 is a diagram showing the relationship between an output signal and the voltages which are outputted at the positive and negative power supply terminals 27a and 27b in case the output signal $S_R$ or $S_L$ is an actual radio signal such as musical signal for a voice signal.

Figure 11:
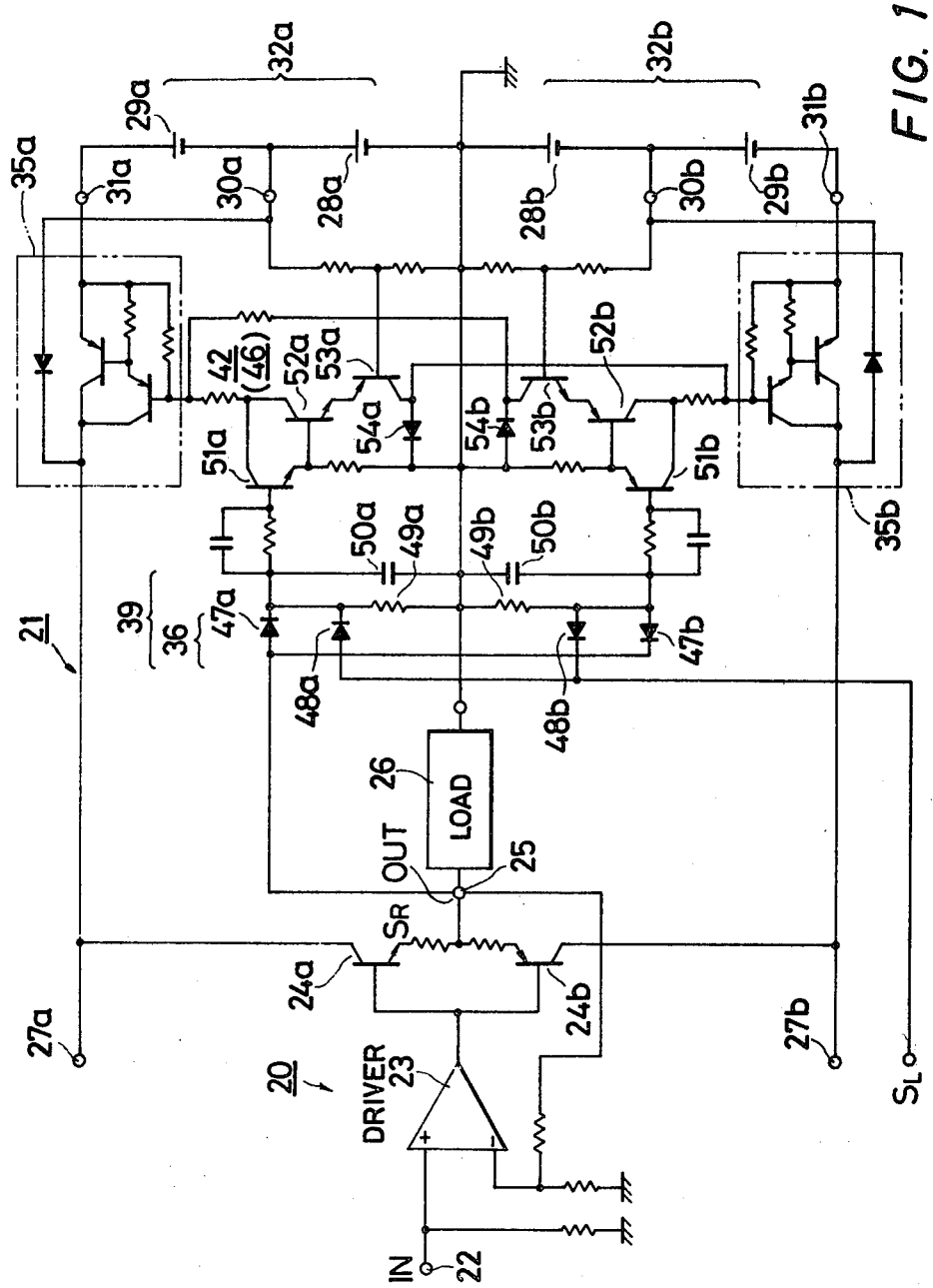
FIG. 11 is a circuit diagram showing a concrete example of the power amplifier shown in FIG. 5.

FIG. 11 is a circuit diagram showing specific circuit arrangement of the power amplifier shown in FIG. 5. It should be understood that in FIG. 11, those parts similar to those shown in FIG. 5 are assigned with like reference numerals.

FIG. 11 will hereunder be explained. The positive region component of either the output signal $S_R$ or $S_L$ is detected by diodes 47a and 48a which jointly constitute an OR circuit 36. The detected voltage component is peak-held by a peak-holding circuit 39 which is comprised of the diodes 47a, 48a, a resistor 49a and a capacitor 50a with a time constant which is determined by the resistor 49a and the capacitor 50a. The peak-held voltage is supplied to a comparator 42 and to a switching control circuit 46. The comparator 42 and the switching control circuit 46 are constructed to have transistors 51a through 53a and a diode 54a. With a reference voltage applied to the base of the transistor 53a, the switching circuits 35a and 35b are controlled of their switching actions in accordance with the aforesaid peak-held voltage.

Circuits similar to those mentioned above are constructed also for the negative region component of the output signal $S_R$ or $S_L$. Here, however, their description is omitted, by simply affixing reference numerals 47b through 54b to those elements corresponding to those in the circuits already mentioned above.

It should be understood that the advantages and functions obtained in the previously described embodiment can be obtained equally effectively also in this specific circuit arrangement of power amplifier.

Figure 12:
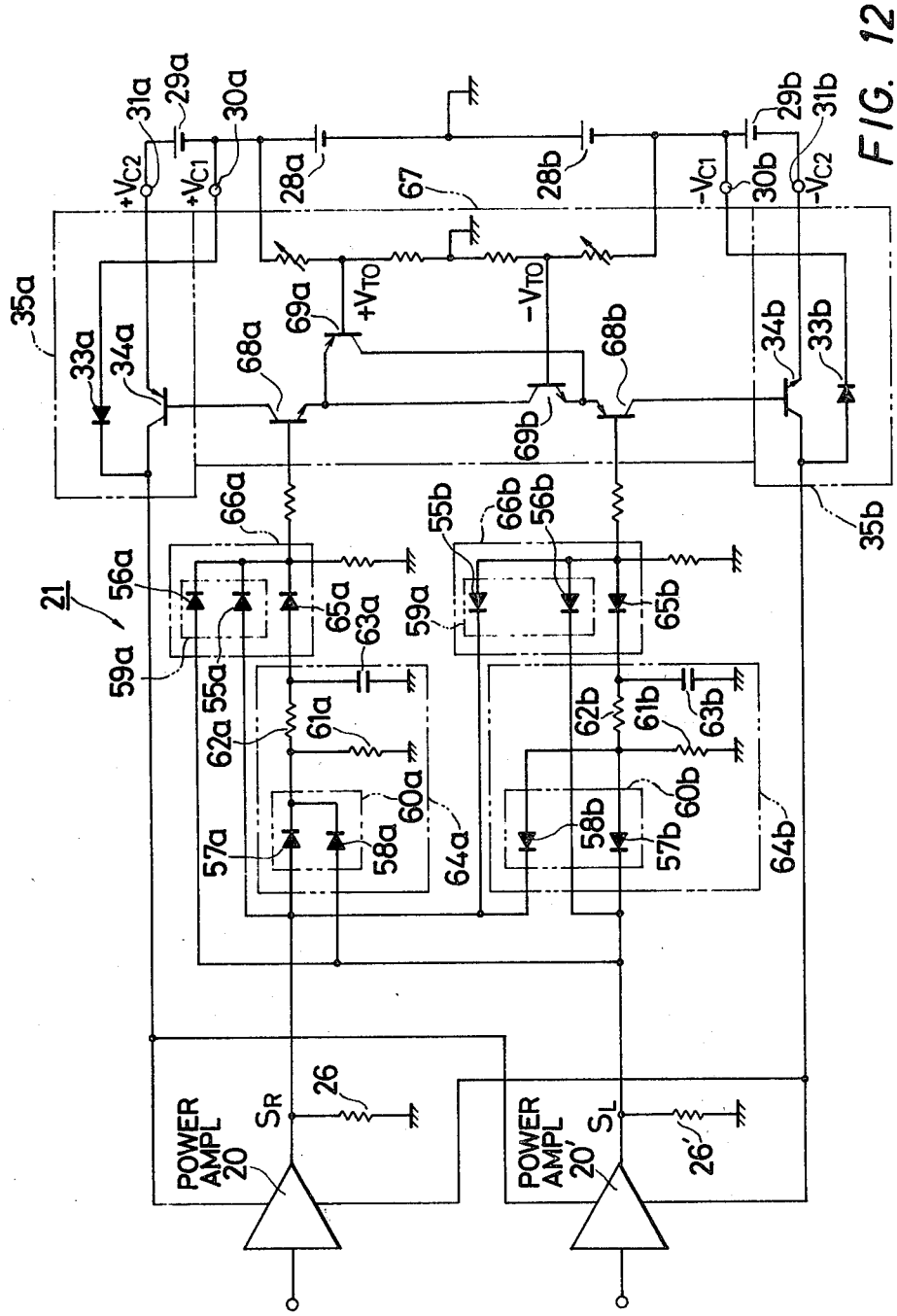
FIG. 12 is a circuit diagram showing another embodiment of the power amplifier according to the present invention.

FIG. 12 is a diagram showing another example of a specific circuit arrangement of the power amplifier according to the present invention. It should be understood here also that like parts shown in FIG. 5 are given like reference numerals in FIG. 12. Now, FIG. 12 will be described as follows. A power amplifying circuit 20 herein illustrated is arranged so as to amplify a right channel signal of a stero signal, and the resulting output signal $S_R$ is used to drive a load 26. Also, a power amplifying circuit 20' is arranged so as to amplify a left channel signal, and the resulting output signal $S_L$ is used to drive a load 26'. These output signals $S_R$ and $S_L$ are supplied to diodes 55a and 56a, respectively, and also to diodes 57a and 58a, respectively. The respective pairs of diodes 55a, 56a and 57a, 58a constitute OR circuits 59a and 60a which rectify the output signals $S_R$ and $S_L$, i.e. obtain the positive region components of the output signals $S_R$ and $S_L$ to take out a signal of higher level between them. The output of this OR circuit 60a is supplied to a peak-holding circuit 64a which is composed by the diodes 57a, 58a which jointly constitute this OR circuit 60a, resistors 61a, 62a and a capacitor 63a. This peak-holding circuit 64a peak-holds the output of the OR circuit 60a, and supplies its peak-held signal to a diode 65a. The diode 65a, jointly with the diodes 55a and 56a of the OR circuit 59a, constitute an OR circuit 66a which takes logical OR of the positive region component of either the output signal $S_R$ or $S_L$ and said peak-held signal. And, the output of this OR circuit 66a is supplied to a transistor 68a of a switching circuit 67. The transistor 68a has its emitter coupled to an emitter of a transistor 69a to the base of which is applied a reference voltage $+V_{TO}$. Accordingly, the transistor 68a is turned "on" when the voltage supplied from the OR circuit 66a has exceeded the reference voltage $+V_{TO}$, causing the transistor 34a of the switching circuit 35a to turn "on", and also causing the transistor 34b of the switching circuit 35b to turn "on". Furthermore, circuits similar to those mentioned above are constructed also for the negative region component of the output signals $S_R$ and $S_L$. However, their description is omitted here, by simply affixing reference numerals 55b through 69b to those element and part corresponding to those mentioned above.

In the circuit shown in FIG. 12, it should be understood that, with respect to the positive region components of the output signals $S_R$ and $S_L$, those positive region components themselves and those voltages which are peak-held by the peak-holding circuit 64a are supplied through the OR circuit 66a to the base of the transistor 68a. Also, with respect to the negative region component of the output signals $S_R$ and $S_L$, those negative region components themselves and those voltages which are peak-held by the peak-holding circuit 64b are supplied through the OR circuit 66b to the base of the transistor 68. Accordingly, in case the absolute value of the voltage of either the output signal $S_R$ or the output signal $S_L$ has exceeded beyond the reference voltage $V_{TO}$, i.e. when exceeding substantially beyond the voltage $V_{c1}$, the transistors 34a and 34b are turned "on". Also, when the absolute value of the above-said voltage has dropped below the reference voltage $V_{TO}$, the transistors 34a and 34b are turned "off" after a lapse of a predetermined length of time which is determined by the time constant of the peak-holding circuit 64a or 64b.

Accordingly, in the circuit of this embodiment also, it is possible to make the switching timing of these power supply voltages in much the same way as that described in connection with the circuit shown in FIG. 5. In addition, in order to compensate for a delay in the operation of the peak-holding circuits 64a and 64b, there is formed a bypass line by the use of diodes 53a, 56a and 55b, 56b. Therefore, when the voltages of the output signals $S_R$ and $S_L$ exceed the reference voltage $V_T$, the switching circuits 35a and 35b will operate without any delay.

Figure 13:
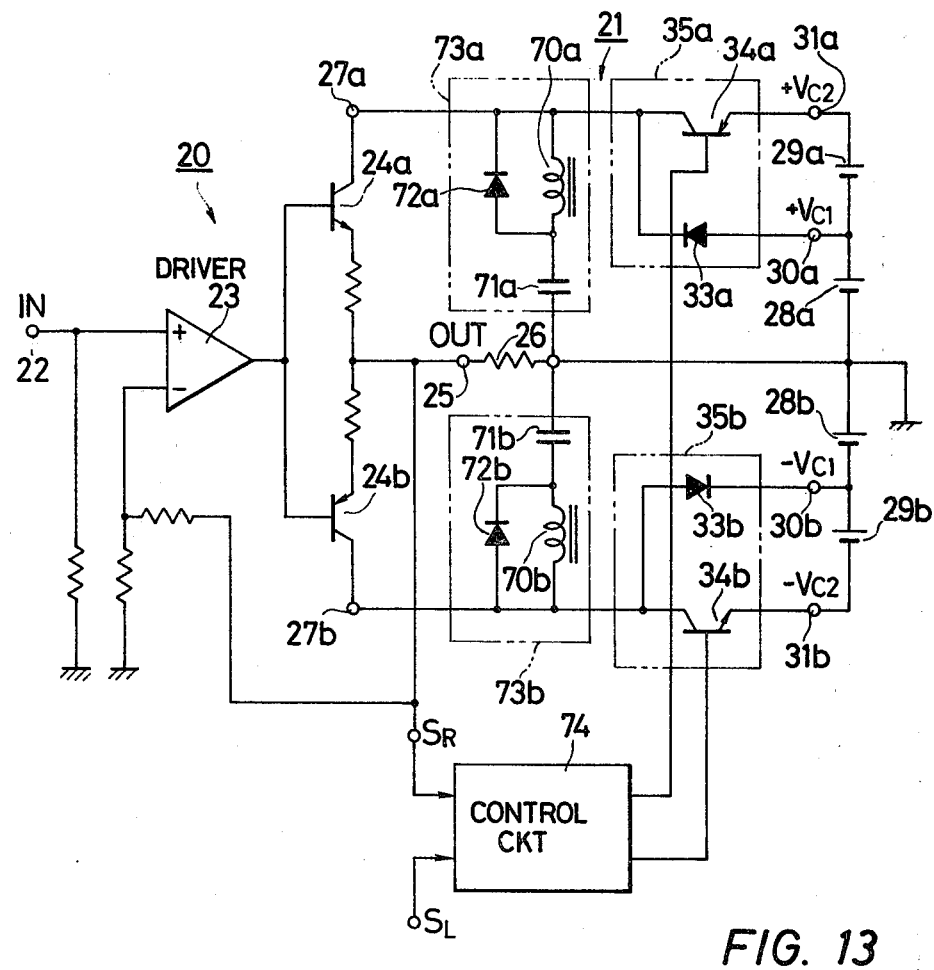
FIG. 13 is a circuit diagram showing still another embodiment of the power amplifier according to the present invention.

FIG. 13 is a diagram showing still another embodiment of the power amplifier according to the present invention. Those parts and elements similar to those shown in FIGS. 5 and 11 are assigned with similar reference numerals, and their explanation is omitted for the purpose of simplicity.

Between a switching circuit 35c and a positive power supply terminal 27a is inserted a switching spike inhibiting circuit 73a which is composed with a coil 70a, a capacitor 71a and a diode 72a. In a similar way, between a switching circuit 35b and a negative power supply terminal 27b is inserted a switching spike inhibiting circuit 73b which is comprised of a coil 70b, a capacitor 71b and a diode 72b. These switching spike inhibiting circuits 73a and 73b operate to serve so that, when the respective output voltages at the positive and negative power supply terminals 27a and 27b are switched from high level voltages $+V_{c2}$, $-V_{c2}$ to low level voltages $+V_{c1}$, $-V_{c1}$, these voltages $+V_{c2}$ and $-V_{c2}$ are caused to either decay gently or to build up gently with a certain time constant.

Figure 14:
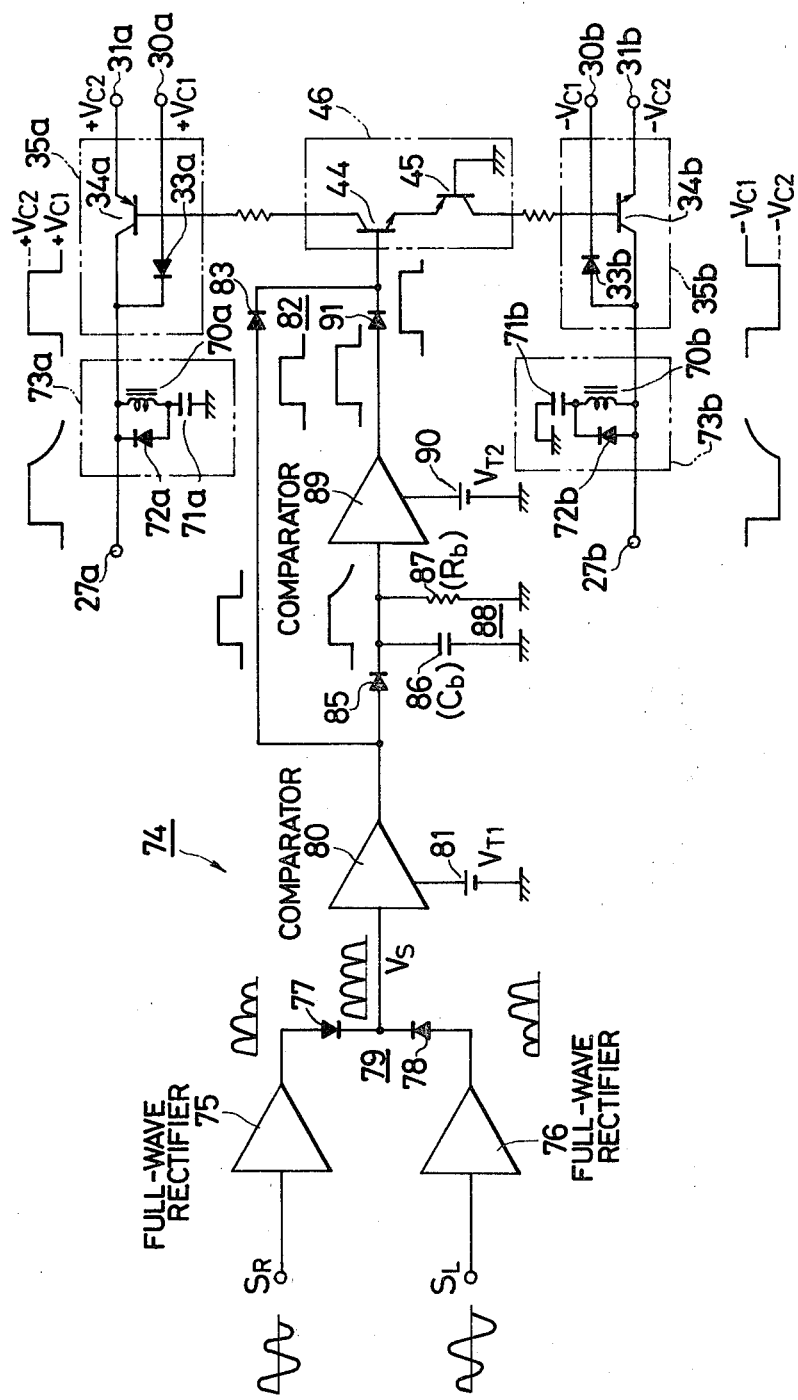
FIG. 14 is a detailed circuit diagram of the control circuit of the power amplifier shown in FIG. 13.

A control circuit 74 is intended to make the aforesaid control action on the basis of an output signal $S_R$ which is derived at an output terminal 25 of a power amplifying circuit 20 and also on an output signal $S_L$ of another power amplifying circuit not shown. The arrangement of this control circuit 74 is as shown in FIG. 14.

More particularly, the control circuit 74, as its first step, subjects the respective output signals $S_R$ and $S_L$ to full-wave rectification by full-wave rectifying circuits 75 and 76, which indeed are absolute-value amplifying circuits, i.e. meaning the respective absolute values of the output signals $S_R$ and $S_L$ are taken out, and these rectified outputs are supplied to an OR circuit 79 which comprises diodes 77 and 78. This OR takes logical OR of these respective rectified outputs, and supplies a rectified output of high level to a comparator 80. This comparator 80 compares the voltage $V_s$ supplied from the OR circuit 79 with the reference voltage $V_{T1}$ which is applied from a reference power supply 81, and delivers a high level signal only when $V_s > V_{T1}$. This output of the comparator 80 is supplied, via a diode 83, to the base of a transistor 44. Concurrently, this output is supplied to a peak-holding circuit 88 which comprises a diode 85, a capacitor 86 having a value $C_b$ and a resistor 87 having a value $R_b$. This peak-holding circuit 88 holds the output of the comparator 80 for a period of time T which is determined by a time constant $C_b \cdot R_b$, and supplies its holding signal to a comparator 89. This comparator 89 compares the holding signal with a reference voltage $V_{T2}$ which is applied from a reference power supply 90, and delivers a high level signal only when the value of said holding signal exceeds the reference voltage $V_{T2}$. This high level output is coupled through a diode 91 which constitutes an OR circuit 82 together with the diode 83, to be supplied to the base of the transistor 44. This OR circuit 82 operates in such way that, when either one of the output of the comparator 80 and the output of the comparator 89 is high level, it causes the base of the transistor 44 to be at a high level. This transistor 44 switches on-off as its base potential is controlled. The on-off switching of the transistor 44 controls the on-off switching of transistor 34a and the on-off switching of transistor 45 controls the on-off switching of the transistor 34b.

Next, description will hereunder be made of the operation of the power amplifier having the aforesaid arrangement.

Firstly, in case the absolute value of the voltage of either the output signal $S_R$ of the illustrated power amplifying circuit 20 or the output signal $S_L$ of another power amplifying circuit not shown is lower than a threshold value $V_{th}$ which corresponds to $V_{T1}$ in this example and is set at a level slightly lower than $V_{c1}$, there are outputted respective voltages $+V_{c1}$ and $-V_{c1}$ at the positive and negative power supply terminals 27a and 27b of the power supply circuit 21, respectively. Whereupon, those transistors in the output stages of the respective power amplifying circuits are caused to operate with these voltages $+V_{c1}$ and $-V_{c1}$, respectively. In such part of operation, the voltage $V_s$ which is inputted to the comparator 80 via the full-wave rectifying circuits 75 and 76 and via the OR circuit 79, i.e. the absolute value of the voltage of either the output signal $S_R$ or $S_L$, has a value lower than the reference voltage $V_{T1}$ of the reference power supply 81. Accordingly, the comparator 80, at such time, outputs a low level signal. The output of the comparator 89 will be at low level at such time, since the signal which is inputted thereto via the peak-holding circuit 88 from the comparator 80 is at low level, i.e. a value lower than the reference voltage $V_{T2}$ of a reference power supply 90. Whereby, the OR circuit 82 outputs a low level signal, and renders the base potential of the transistor 44 to low level. Accordingly, the transistors 44 and 45, at such time, are rendered to their "off" state, and the transistors 34a and 34b are also rendered to their "off" state. As a result, there are outputted, at the positive and negative power supply terminals 27a and 27b, those voltages $+V_{c1}$ and $-V_{c1}$ which are supplied from the respective terminals 30a and 30b after passing through the diodes 33a and 33b. Accordingly, those transistors of the output stages of the power amplifying circuits will operate with said voltages $+V_{c1}$ and $-V_{c1}$, respectively.

Also, in case the absolute value of the voltage of the output signal $S_R$ or $S_L$ exceeds the aforesaid threshold level $V_{th}$, the output voltages at the positive and negative power supply terminals 27a and 27b are switched to $+V_{c2}$ and $-V_{c2}$, respectively. More particularly, in such instance, the voltage $V_s$ will assume a value exceeding beyond the aforesaid reference voltage $V_{T1}$. At such time, the comparator 80 will output a high level signal. Also, because of the fact that the signal which is inputted to the comparator 89 via the peak-holding circuit 88 from the comparator 80 becomes high level, i.e. meaning a value higher than the reference voltage $V_{T2}$, the output of the comparator 89 will also be at high level. During this part of operation, it should be understood that the comparator 89 obtains a high level signal from the comparator 80 after being passed through the peak-holding circuit 88, and that, therefore, the build-up timing of the output of this comparator 89 is slightly delayed than the build-up timing of the output of the comparator 80 due to the charging time constant of diode 85 and capacitor 86. Accordingly, in such instance, the output of the OR circuit 82 is determined of its build-up timing by the output of the comparator 80. Accordingly, the transistor 44 will be rendered to its "on" state at the build-up timing of the output of the comparator 80, i.e. the transistor 44 will turn "on" at the same time the absolute value of the voltage of either the output signal $S_R$ or $S_L$ exceeds the aforesaid threshold value $V_{th}$. Whereby, the transistor 44 renders the transistor 34a to its "on" state, and concurrently therewith, it turns the transistor 34b "on" via the transistor 45. As a result, there are outputted, at the positive and negative power supply terminals 27a and 27b, voltages $+V_{c2}$ and $-V_{c2}$ which are supplied from the respective terminals 31a and 31b and via the transistors 34a and 34b, respectively. In such instance, the diodes 33a and 33b serve to prevent the occurrence of interference between the voltages $+V_{c2}$, $-V_{c2}$ derived at the positive and negative power supply terminals 27a and 27b and the voltages $+V_{c1}$, $-V_{c1}$ at the terminals 30a and 30b. Accordingly, those transistors in the output of the respective power amplifying circuits will operate with the aforesaid voltages $+V_{c2}$ and $-V_{c2}$, respectively.

Figure 15:
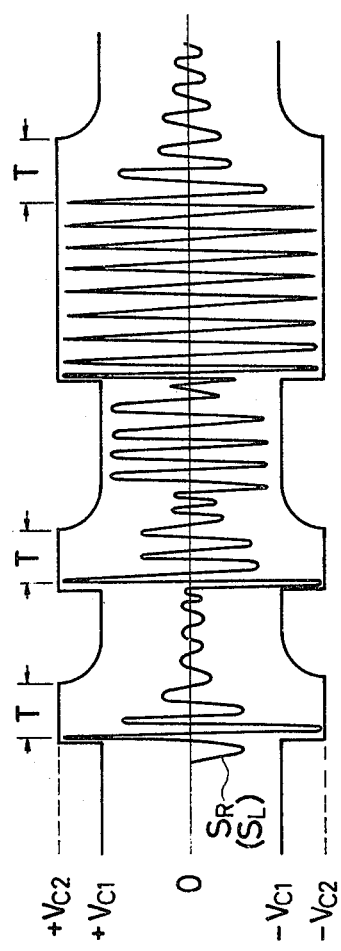
FIG. 15 is a diagram showing the relationship between the output signals $S_R$ and $S_L$ of the power amplifier shown in FIG. 13 and the power supply voltages $V_{c1}$ and $V_{c2}$.

Also, in case the absolute value of the voltage of the output signal $S_R$ or $S_L$ has dropped from the aforesaid conditions to a value below said threshold value $V_{th}$, the output voltages of the positive and negative power supply terminals 27a and 27b are switched in the following manner. That is, the output of the comparator 80 at such time assumes low level because the voltage $V_s$ assumes a value lower than the reference voltage $V_{T1}$. On the other hand, at such time, the peak-holding circuit 88 holds a high level signal for a period of time $T_a$, even when the output of the comparator 80 has been switched from the high level to low level, and it supplies this holding voltage to the comparator 89. Accordingly, the output of the comparator 89 at such time will be switched to low level after a lapse of time T which is determined by said time $T_a$ and the reference voltage $V_{T2}$, starting at the time when the output of the comparator 80 was switched from high level to low level (See FIG. 15). As a result, the output of the OR circuit 82 is switched from high level to low level with a timing of the output supplied from the comparator 89. Whereby, in much the same way as described above, the transistors 44 and 45 are rendered to their "off" state, and accordingly the transistors 34a and 34b are rendered also to their "off" state. Thus, the voltages of the positive and the negative power supply terminals 27a and 27b are switched from $+V_{c2}$, $-V_{c2}$ to $+V_{c1}$, $-V_{c1}$, respectively.

At the time of such switching of the power supply voltages as described above, the switching spike inhibiting circuits 73a and 73b switch the respective voltages $+V_{c2}$ and $-V_{c2}$ to voltages $+V_{c1}$ and $-V_{c1}$ with a certain time constant. That is, among these switching spike inhibiting circuits 73a and 73b, the former 73a for example will be operated in such way that, when the voltage outputted from the switching circuit 35a is $+V_{c2}$ the capacitor 71a of the switching spike inhibiting circuit 73a is charged up with the voltage $+V_{c2}$. In such instance, this voltage $+V_{c2}$ is supplied from the collector of the transistor 34a, through a coil 70a of a high impedance, to the capacitor 71a. And, when the output voltage of the switching circuit 35a is switched from $+V_{c2}$ to $+V_{c1}$, the electric charge of the capacitor 70a is supplied, through a diode 72a, to the positive power supply terminal 27a. The output voltage of this positive power supply terminal 27a, thus, decays gradually in accordance with the discharging characteristic of the capacitor 71a. The switching spike inhibiting circuit 73b also operates in a manner similar to that described just above, allowing the output voltage of the negative power supply terminal 27b to decay gradually.

In a manner as described above, the respective power amplifying circuits are switched of their power supply voltages in accordance with the signal level of the output signal $S_R$ or $S_L$. Thus, the amplifier is able to operate with good power efficiency in accordance with the levels of the output voltages, without the occurrence of saturation of the transistors which are provided in the respective output stages of these amplifying circuits. In such operation, it should be understood that, from the trend of the operating steps that the output of the comparator 80 is supplied, via the diode 83 of the OR circuit 82, directly to the base of the transistor 44, the timing at which the voltages $+V_{c1}$, $-V_{c1}$ are switched to voltages $+V_{c2}$, $-V_{c2}$ is in agreement with the timing at which the absolute value of the voltage of the output signal $S_R$ of $S_L$ exceeds the aforesaid threshold value $V_{th}$, without any delay. Also, the timing at which the voltages $+V_{c2}$, $-V_{c2}$ are switched to $+V_{c1}$, $-V_{c1}$ is, indeed, the timing which comes at the end of a lapse of a certain time T from the time at which the absolute value of the voltage of the output signal $S_R$ or $S_L$ has dropped below the threshold value $V_{th}$. Accordingly, by setting this time T to, for example, a time corresponding to the lowest frequency of an audio signal (output signal $S_R$ or $S_L$), it becomes unnecessary to effect the switching of the power supply voltage for each occurrence of high frequency signal, and thus it is possible to greatly reduce the development of switching noises in the respective power amplifying circuits. It should be noted also that, in this embodiment, a switching spike inhibiting circuit 73a is provided, so that it is possible to more effectively reduce the development of switching noises.

Figure 16:
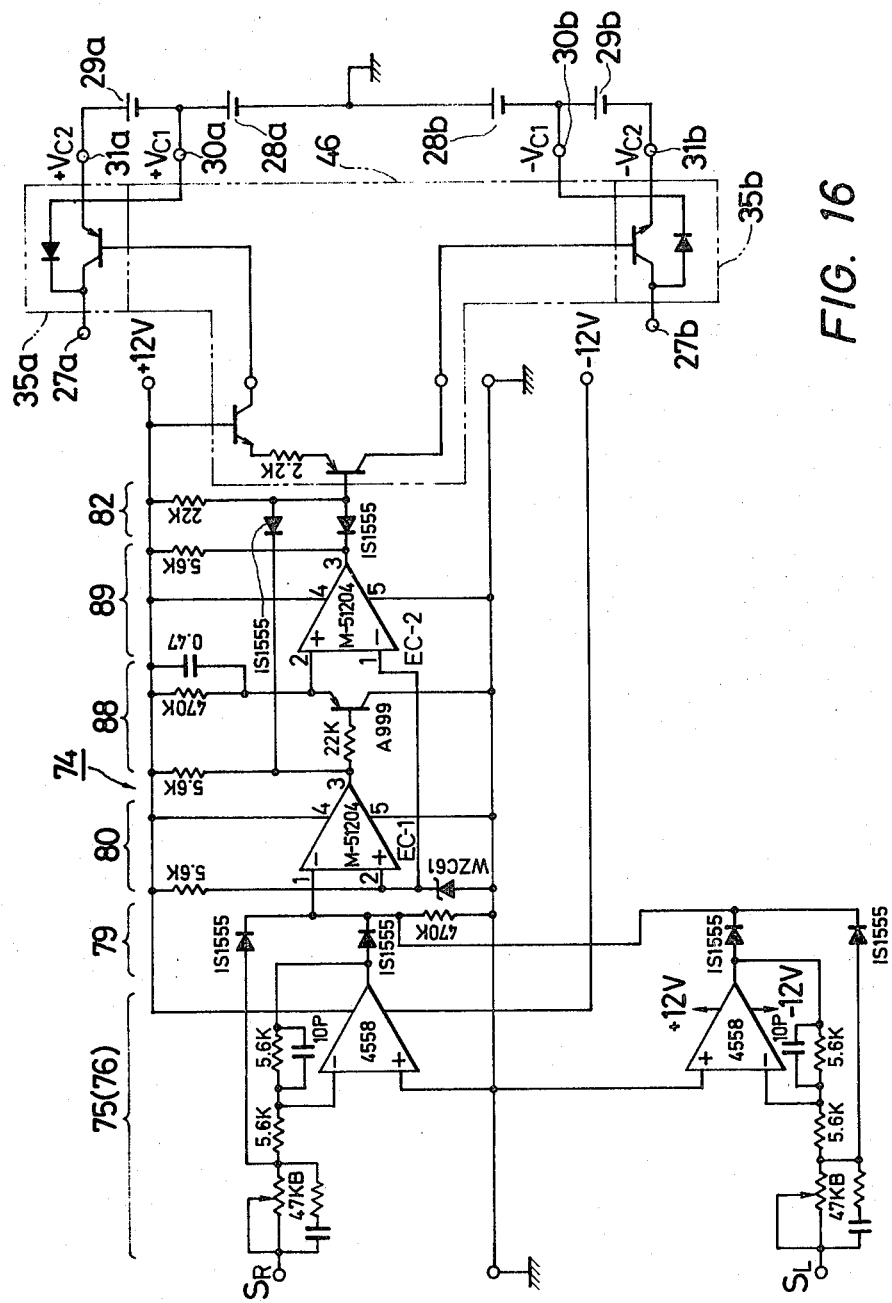
FIG. 16 is a circuit diagram showing a concrete circuit arrangement of the power amplifier shown in FIG. 14.

FIG. 16 is a circuit diagram showing an example of a specific circuit arrangement of the essential portions of the power amplifier shown in FIGS. 13 and 14. In FIG. 16, those parts and elements similar to those shown in FIGS. 13 and 14 are given similar reference numerals. It should be understood also that the numerical values and symbols which are mentioned only in FIG. 16 represent the values and forms of the respective elements employed.

Figure 17:
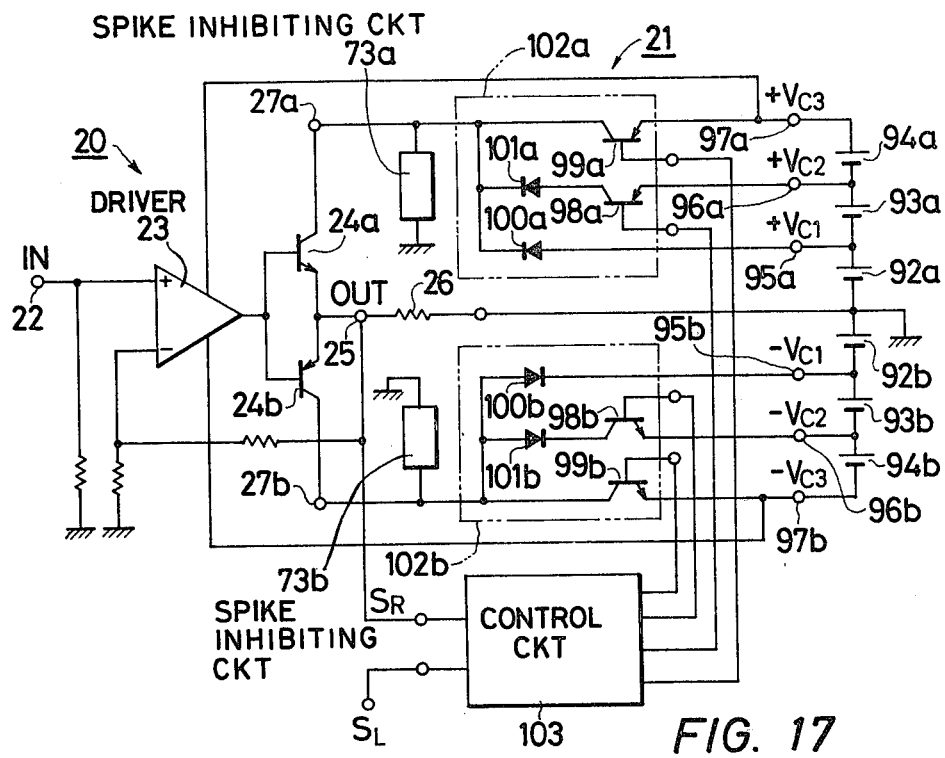
FIG. 17 is a circuit diagram showing yet another embodiment of the power amplifier according to the present invention.
Figure 18:
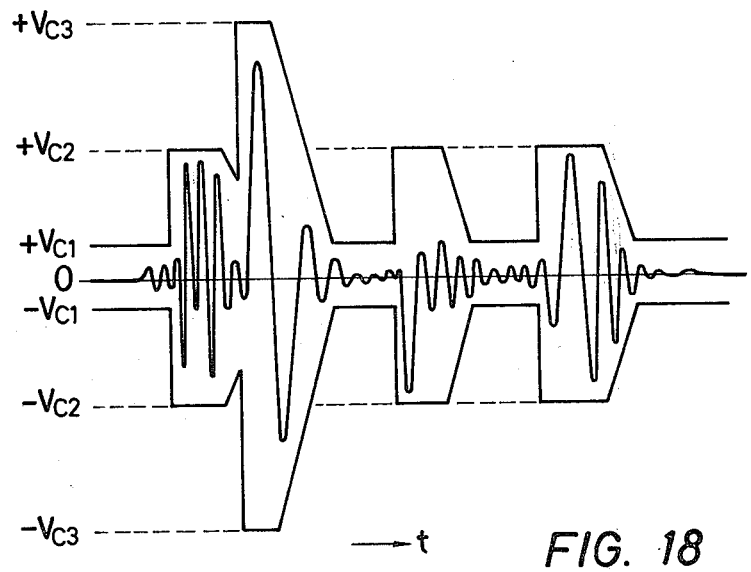
FIG. 18 is a diagram showing the relationship between the output signals $S_R$ and $S_L$ of the power amplifier shown in FIG. 17 and the power supply voltages $V_{c1}$, $V_{c2}$ and $V_{c3}$.

FIG. 17 is a circuit diagram of the power amplifier representing a further embodiment of the present invention. This embodiment shown here is of the arrangement so that the power supply voltage for the power amplifying circuits can be switched in three different stages. In FIG. 17 also, those structural elements similar to those shown in FIG. 13 are given similar reference numerals. This FIG. 17 will hereunder be described. A power supply circuit 21 has both positive and negative power supplies 92a to 94a and 92b to 94b, respectively, and this circuit 21 is arranged so that voltages $+V_{c1}$, $+V_{c2}$, $+V_{c3}$ and $-V_{c1}$, $-V_{c2}$, $-V_{c3}$ are derived at terminals 95a to 97a and 95b to 97b, respectively. A switching circuit 102a which is comprised of transistors 98a, 99a and diodes 100a, 101a is provided between the terminals 95a to 97a and the positive power supply terminal 27a. Also, between the terminals 95b to 97b and the negative power supply terminal 27b is inserted a switching circuit 102b which is formed with transistors 98b, 99b and diodes 100b, 101b. This power amplifier circuit is also arranged so that the respective on-off actions of the transistors 98a, 99a and 98b, 99b are controlled by a control circuit 103. The basic structure of this control circuit 103 is similar to that shown in FIG. 14. That is, the control circuit 103 is arranged to be operative that, when the level of the output signal $S_R$ or $S_L$, in its positive or negative region component, exceeds a first reference voltage, i.e. $+V_{E1}$ in the positive region, and $-V_{E1}$ in the negative region, the transistors 98a and 98b are rendered "on", and that, likewise when said level of the output signal exceeds a second reference voltage, i.e. $+V_{E2}$ in the positive region, and $-V_{E2}$ in the negative region, the transistors 99a and 99b are rendered "on". In the arrangement shown in FIG. 17, it is possible to switch the voltages which are supplied from the positive and negative power supply terminals 27a and 27b to the output stage transistors 24a and 24b, in three different stages in such manner as shown in FIG. 18 in accordance with the level of the output signal $S_R$ or $S_L$.

In the respective embodiments described above, arrangement is provided so that the switching of the power supply voltage for two-channel power amplifying circuits is carried out in such way that, when the output signal of either one of the power amplifying circuits exceeds a reference value, the power supply voltages of both power amplifying circuits are switched over simultaneously. It should be understood that such switching may be performed independently for each power amplifying circuit. Also, in the respective embodiments, the switching of both positive and negative power supply voltages is arranged to be carried out when the output signal of the power amplifying circuit exceeds a reference value in either one of the positive and negative regions of voltage. Such switching may be arranged so as to be carried out independently for each of the positive and negative power supply voltages. It should be understood also that the signal which is employed for the purpose of performing the switching operation need not be limited to the output signal of the power amplifying circuit, but it may be any signal provided that it varies in accordance with the input signal of this circuit. Furthermore, the number of stages of switching of power supply voltage may be multiple-stage switching of four or more.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. An amplifier with power supply switching, comprising:
   an amplifying element for amplifying the input signal to said amplifier;
   a peak-holding circuit for holding, for a predetermined period of time, a peak value of a signal which varies in accordance with said input signal; and
   a switching circuit for selectively supplying to said amplifying element a supply voltage level selected from among at least two available supply voltage levels in accordance with a level of an output of said peak-holding circuit.

2. An amplifier according to claim 1, in which:
   said predetermined period of time of holding a peak value of said input signal is a period of time corresponding to a lowest frequency of said input signal.

3. An amplifier according to claim 1, in which:
   said peak-holding circuit comprises a first reverse-current inhibiting diode, and a resistor and a first capacitor both of which are connected in parallel between said first diode and circuit ground.

4. An amplifier according to claim 1, in which:
   said peak-holding circuit is connected to said switching circuit through a comparator to which is applied a reference signal of comparison so that the comparator compares the output of said peak-holding circuit with the reference signal, an output of said comparator being connected to an input of said switching circuit.

5. An amplifier according to claim 1, further comprising:
   a rectifying circuit for rectifying said signal varying in accordance with said input signal, before being supplied to said peak-holding circuit.

6. An amplifier according to claim 4, further comprising:
   an OR circuit provided between the output of said comparator and the input of said switching circuit for being applied with the output of said comparator and also with a signal identical with an input signal for said peak-holding circuit.

7. An amplifier with power supply switching, comprising:
   an amplifying element for amplifying an input signal to said amplifier;
   a first comparator for comparing said input signal with a first reference signal;
   a peak-holding circuit for holding, for a predetermined period of time, a peak value of an output of said first comparator; and
   a switching circuit for selectively supplying to said amplifying element with a supply voltage among a plurality of supply voltages in accordance with a level of an output of said peak-holding circuit.

8. An amplifier according to claim 7, in which:
   said predetermined period of time of holding the peak value of an output of said first comparator is a period time corresponding to a lowest frequency of said input signal.

9. An amplifier according to claim 7, in which:
   said peak-holding circuit is comprised of a first reverse-current inhibiting diode, and a resistor and a first capacitor both of which are connected in parallel between an output side of said first reverse-current inhibiting diode and circuit ground.

10. An amplifier according to claim 7, further comprising:
    a second comparator provided between an output side of said peak-holding circuit and an input side of said switching circuit and having a second reference value for detecting said peak-holding value.

11. An amplifier according to claim 7, further comprising:
    a rectifying circuit for rectifying said input signal before being applied to said peak-holding circuit.

12. An amplifier according to claim 10, further comprising:
    an OR circuit provided between an output side of said second comparator and the input side of said switching circuits for being applied with an output of said second comparator and a signal identical with an input signal for said second peak-holding circuit.

13. An amplifier according to claim 1 or 7, further comprising:
    a switching spike inhibiting circuit connected between an output side of said switching circuit and circuit ground for causing an output voltage of said switching circuit to vary gently as said output voltage is switched from a high voltage level to a low voltage level.

14. An amplifier according to claim 13, in which:
    said switching spike inhibiting circuit is comprised of a parallel connection of a coil and a second reverse-current inhibiting diode, and of a second capacitor connected in series to said parallel connection, respectively, and in which:
    one terminal of parallel connection is connected to an output side of said switching circuit, and the other terminal thereof is connected to one terminal of said second capacitor having the other terminal grounded.

15. An amplifier according to claim 1 or 7, in which:
    said power amplifying element, said peak-holding circuit and said switching circuit are arranged independently for each of positive power supply and negative power supply.

16. An amplifier according to claim 15, in which:
    the switching circuit for the positive power supply side is controlled in accordance with said input signal for the power amplifying element on the positive power supply side and in which:
    the switching circuit for the negative power supply side is controlled in accordance with said input signal for the power amplifying power element on the negative power supply side.

17. An amplifier according to claim 16, in which:
    the switching circuit on the positive power supply side is controlled in accordance with the input signal for the power amplifying element on the positive power supply side, and in which:

the switching circuit on the negative power supply side is controlled in accordance with the input signal for the power amplifying element on the negative power supply side.

18. An amplifier according to claim 1 or 7, in which:
said power amplifying element, said peak-holding circuit and said switching circuit are provided independently for each of a right-channel side and a left-channel side of an stereophonic audio device.

19. An amplifier according to claim 18, in which:
the switching circuit on the right-channel side is controlled in accordance with the input signal for the power amplifying element on the right-channel side, and in which:
the switching circuit on the left-channel side is controlled in accordance with the input signal for the power amplifying element on the left-channel side.

20. An amplifier according to claim 18, in which:
both of the switching circuit on the right-channel side and the switching circuit on the left-channel side are controlled in accordance with the input for the power amplifying element on the right-channel side and with the input for the power amplifying element on the left-channel side.

21. An amplifier, comprising:
an amplifying element for amplifying an input signal;
a power supply capable of providing at least two different voltage levels to the amplifying element;
a peak-holding circuit for providing a peak signal corresponding to a peak of an output signal of the amplifying element and holding that peak value for a predetermined period of time;
a comparator for comparing the peak signal with a predetermined threshold level and providing a comparison signal indicative of the comparison result; and
a switching circuit for selecting, responsive to the comparison signal, one of the at least two different voltage levels of the power supply for application to the amplifying element, whereby the voltage applied to the amplifying element is increased to the higher of the at least two voltage levels as necessary to avoid distortion of an amplified signal and decreased to the lower of the at least two voltage levels to enhance operating efficiency of the amplifier when an increased voltage is not required to prevent distortion, the frequency of switching between power supply voltage levels being minimized by the predetermined holding time period provided by the peak-holding circuit.

22. An amplifier according to claim 21, further including:
a second amplifying element for amplifying a second input signal, the power supply being coupled to both amplifying elements; and
an OR-circuit coupling each of the amplifying elements to the peak-holding circuit so as to generate and hold a peak signal for peaks of outputs of either of the amplifying elements.

23. An amplifier according to claim 21, further including an absolute value circuit coupled between the amplifying element and peak holding circuit so that the peak holding circuit will produce a peak signal for both positive and negative excursions of the output signal of the amplifying element.

24. An amplifier according to claim 23, wherein the absolute value circuit comprises a rectifier circuit.

25. An amplifier according to claim 21, wherein the predetermined holding time provided by the peak-holding circuit is selected to be substantially the period of the lowest frequency components expected to be in the input signal.

26. An amplifier according to claim 21, further including a spike inhibiting circuit for preventing abrupt changes in power supply voltage level applied to the amplifying element when switching from one voltage level to another.

* * * * *